US006260611B1

United States Patent
Whieh

(10) Patent No.: US 6,260,611 B1
(45) Date of Patent: Jul. 17, 2001

(54) HEAT DISSIPATION MODULE

(75) Inventor: W. L. Whieh, Taipei (TW)

(73) Assignee: Orient Semiconductor Electronics Ltd., Kaohsiung (JP)

( * ) Notice: Subject to any disclaimer, the term of this patent is extended or adjusted under 35 U.S.C. 154(b) by 0 days.

(21) Appl. No.: 09/459,620

(22) Filed: Dec. 13, 1999

(51) Int. Cl.[7] .................................................. F28F 7/00
(52) U.S. Cl. .................. 165/80.3; 165/185; 165/80.2; 174/16.3; 257/722; 361/705; 361/708; 361/709
(58) Field of Search .................. 174/16.3; 165/80.3, 165/80.2, 185; 257/718, 719, 727, 722; 361/697, 696, 703, 707, 708, 709, 710

(56) References Cited

U.S. PATENT DOCUMENTS

| | | | |
|---|---|---|---|
| 2,711,382 | * 6/1955 | Smith-Johannsen | 165/185 X |
| 3,800,192 | * 3/1974 | Eisele et al. | 165/185 X |
| 4,602,314 | * 7/1986 | Broadbent | 165/185 X |
| 4,885,662 | * 12/1989 | Bartholomew et al. | 165/80.3 X |
| 5,050,040 | * 9/1991 | Gondusky et al. | 165/185 X |
| 5,203,401 | * 4/1993 | Hamburgen et al. | 165/80.4 |
| 5,297,618 | * 3/1994 | Behun et al. | 165/80.3 |
| 5,729,432 | * 3/1998 | Shim et al. | 165/803 X |
| 5,745,344 | * 4/1998 | Baska et al. | 165/185 |
| 5,880,933 | * 3/1999 | Markow et al. | 165/185 X |
| 5,931,222 | * 8/1999 | Toy et al. | 165/185 X |

* cited by examiner

Primary Examiner—Christopher Atkinson
(74) Attorney, Agent, or Firm—A & J

(57) ABSTRACT

A high watt number heat dissipation module having externally exposed fins is disclosed. The high heat produced by semiconductor operation is dissipated employing the present module, and the packaging rubber body is prevented from overflow. The present module is mounted above the semiconductor wafer and the interior of the heat dissipation plate absorbs the high heat from the wafer, and heat energy is dissipated by means of the fins at the top portion of the heat dissipation plate. A plurality layers of skirts are provided at the surrounding of the heat dissipation plate and the number of layers o the skirts is dependent on the watt number of the wafer.

1 Claim, 2 Drawing Sheets

HEAT DISSIPATION MODULE

BACKGROUND OF THE INVENTION (a) Field of the Invention

The present invention relates to a heat dissipation module, and in particular, to a heat dissipation module having externally exposed fins.

(b) Description of the Prior Art

Plastic Ball Grid Array (PBGA) is a packaging technique for integrated circuits and is employed in mass production manufacturing process. First, the wafer (5a) is milled, cut and adhered onto substrate 2a, after a lining process, the aluminum pad of the wafer 5a is connected to the welding line connection leg on the substrate. A gold line 6a is used for communication. The printed circuit board of the substrate 2a is connected to a tin ball connection leg at one side of the substrate 2a. Next, a synthetic resin rubber body 7a is used for packaging to protect the wafer 5a and the gold line 6a. A welding ball 4a containing zinc, lead alloy is implanted onto the tin ball connection leg. Finally, cut off the remaining portion of the substrate 2a. A Plastic Ball Grid Array product is finally obtained. This Plastic Ball Grid Array product is welded to a main computer board 3a to complete the connection of the electronic parts to the main computer board.

In application, the wafer on the substrate produces extreme heat during operation. Thus, a heat dissipation plate having high heat conduction and electrical conduction property is introduced at the top of the wafer of the Plastic Ball Grid Array and connecting the connection leg of the heat dissipation plate, and the ground connection of the PLASTIC BALL GRID ARRAY substrate. Thus, the interior of the heat dissipation plate is used to absorb heat source of the wafer and to dissipate heat energy via the surface of the heat dissipation plate.

In view of the conventional heat dissipation plate being a simple cap-like structure (referring to FIG. 1), a fairly thick layer of synthetic resin rubber body (two times the thickness of a wafer) is mounted in between the heat dissipation plate and the wafer, the heat energy produced by the wafer can reach the heat dissipation plate by the conduction of the synthetic resin rubber body so as to dissipate heat. However, the synthetic resin rubber body is not a good conductor of heat and the heat from the wafer has to pass through the thick synthetic rubber body in order to attain the heat dissipation plate for heat dissipation. Thus, the heat dissipation efficiency is limited.

Thus, the Plastic Ball Grid Array product obtained by this method needs appropriate heat dissipation blades to adhere to the conventional heat dissipation plate so as to dissipate heat. However, to implement this method, the conventional heat dissipation plate is adhered with a dual layer rubber. Generally the heat transfer coefficient of the dual layer rubber is not high, and thus, the entire heat dissipation effect is reduced, and it does not improve heat dissipation. After some period of application, the rubber body is hardened and cracked as a result of heat, and the externally mounted blades will be dislocated.

SUMMARY OF THE PRESENT INVENTION

It is therefore an object of this invention to provide a heat dissipation module having externally exposed fins, wherein a high performance conductive connecting rubber body directly absorbs heat produced from the surface of the wafer and dissipating the heat via the fins on the heat dissipation plate so as to increase heat dissipation effectiveness.

Yet another object of this invention to provide a heat dissipation module having externally exposed fins, wherein a plurality of protruded layers at the external of the heat dissipation plate are used to improve heat dissipation effectiveness, and to provides positioning engagement and to prevent the overflow of the synthetic resin rubber body.

Yet another object of the invention to provide a heat dissipation module having externally exposed fins, wherein the fin extended upward from the top section of the heat dissipation plate is used to increase the amount of the dissipated heat.

DETAILED DESCRIPTION OF THE PRESENT INVENTION

Figure 1:
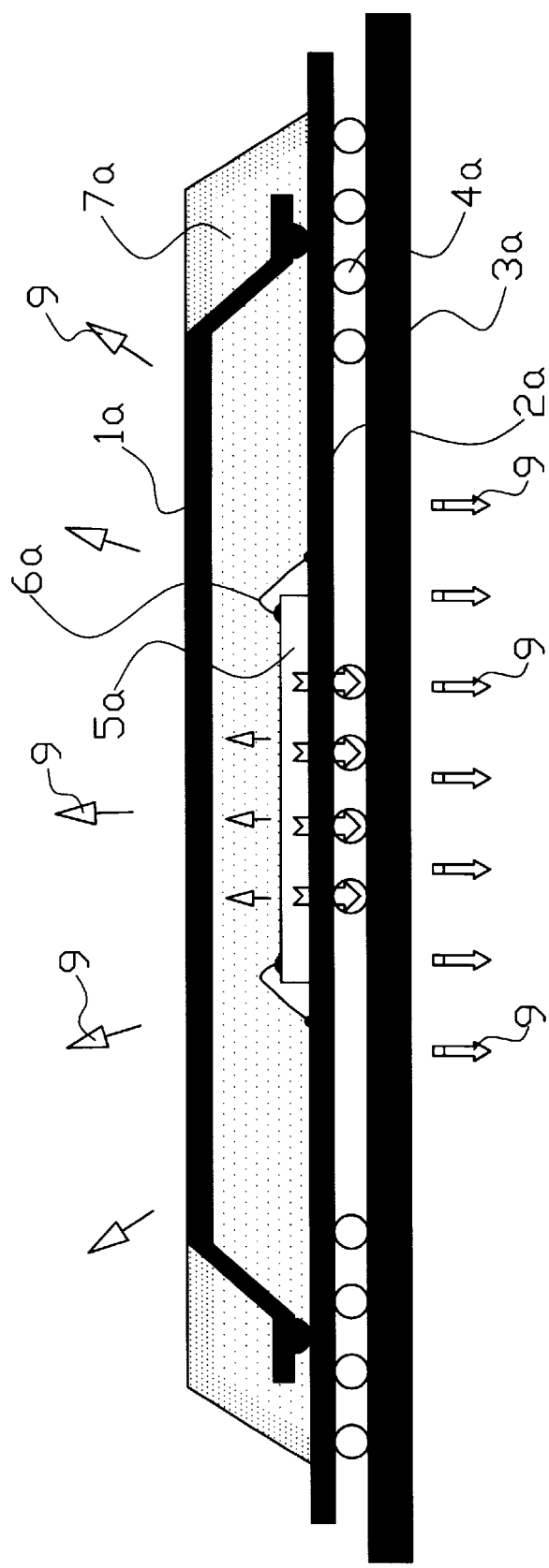
FIG. 1 is a schematic view of the heat dissipation plate of a conventional Plastic Ball Grid Array product.
Figure 2:
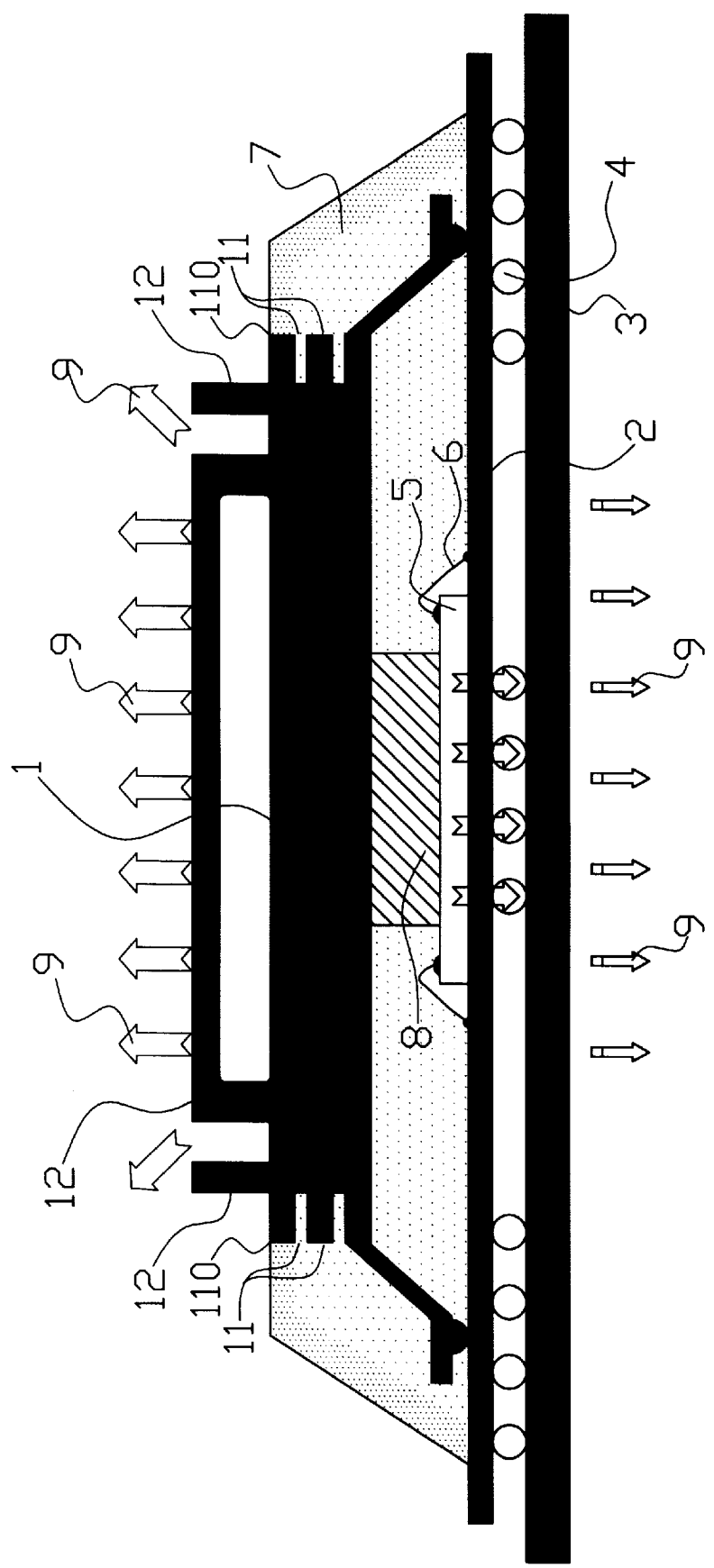
FIG. 2 is a schematic view of the heat dissipation module in accordance with the present invention.

The present invention relates to an engagement type, externally exposed fin heat dissipation module (as shown in FIG. 2), comprising a heat dissipation plate having a top section having a plurality of fins 12, and surrounded by a plurality layers of protruded skirts 11.

In the process of manufacturing, the heat dissipation plate 1 of the present invention is provided directly above the wafer 5 and an elastic heat conduction adhesive rubber body 8 is connected to the top surface of the wafer 5 and the bottom surface of the interior of the heat dissipation plate 1. After that, a layer of synthetic resin rubber body 7 is provided to the interior and the exterior of the heat dissipation plate 1, and the boundary of the height of the rubber body 7 is at the highest level of the skirt 11. A protruded body lateral edge 110 of the skirt 11 leans against a rubber injection device to avoid the overflow of the synthetic resin rubber body 7. The synthetic resin rubber body 7 is provided to the internally covered area of the heat dissipation plate and distributed within the internally covered area of the heat dissipation plate 1 and the internally covered wafer 5, and the rest of the space of the elastic heat conduction adhesive rubber body 8.

In accordance with the present invention, the heat energy produced by the wafer 5 is directly in contact with the heat conductive adhesive rubber body 8 which directly absorbs the heat that enters the dissipation plate 1. The fins 12 at the top of the heat dissipation plate 1 are used to extend the heat dissipation area so as to dissipate heat. Also, the plurality layers of skirt 11 at the surrounding of the heat dissipation plate 1 are also helpful in dissipation of heat energy.

The number of layers of the skirts is varied in accordance with the covered wafer watt number. For each layer of increment, the function of substantial heat dissipation area is increased. Thus it is easier to increase the number of layers to suit high watt number heat dissipation wafer, and the top portion of the skirt 11 is also functioned as a boundary to prevent overflow of synthetic resin rubber body 7. The notch of the skirts 11 is a mechanism providing the engagement of synthetic resin rubber body 7, and to enhance positioning of the module and to improve its reliability.

While the invention has been described by way of example, it is to be understood that the invention is not limited to the disclosed embodiment.

In the contrary, it is intended to cover various modifications to improve heat dissipation effect of PGBA. Therefore, the scope of the appended claims should be accorded broadest interpretation as to encompass all such modifications.

What is claimed is:

1. A heat dissipation module comprising a heat dissipation plate having a top section formed a plurality of upwardly extending fins and a plurality of protruded skirts surrounding said heat dissipation plate, wherein said heat dissipation plate is provided directly above a wafer and an elastic heat conduction adhesive rubber body is connected to a top surface of said wafer and a bottom surface of said heat dissipation plate, a layer of synthetic resin rubber body is provided to interior and exterior of said heat dissipation plate such that a top of said synthetic resin rubber body is even with a top of highest one of said skirts, said skirts have a protruded body lateral edge which is a boundary to prevent overflow of said synthetic resin rubber body, said synthetic resin rubber body is provided to internally covered area of said heat dissipation plate and enclose said elastic heat conduction adhesive rubber body.

* * * * *